US010123461B2

(12) United States Patent
Jochim et al.

(10) Patent No.: US 10,123,461 B2
(45) Date of Patent: Nov. 6, 2018

(54) COOLING ELECTRONIC DEVICES IN A DATA CENTER WITH COOLING UNITS MOUNTED IN BAYS OF A SERVER RACK FRAME ASSEMBLY

(71) Applicant: Google LLC, Mountain View, CA (US)

(72) Inventors: Jayson Michael Jochim, Mountain View, CA (US); Angela Chen, Mountain View, CA (US); Soheil Farshchian, San Jose, CA (US); Winnie Leung, Palo Alto, CA (US); Michael Chi Kin Lau, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/479,740

(22) Filed: Apr. 5, 2017

(65) Prior Publication Data
US 2018/0295751 A1 Oct. 11, 2018

(51) Int. Cl.
H05K 7/20 (2006.01)
H05K 7/14 (2006.01)

(52) U.S. Cl.
CPC ....... H05K 7/20745 (2013.01); H05K 7/1489 (2013.01); H05K 7/20736 (2013.01); H05K 7/20827 (2013.01); H05K 7/20836 (2013.01)

(58) Field of Classification Search
CPC .......... H05K 7/20709; H05K 7/20745; H05K 7/20836; H05K 7/20827; H05K 7/1489
USPC .................. 361/689–691, 694–695; 454/184
See application file for complete search history.

(56) References Cited

U.S. PATENT DOCUMENTS

| 4,992,669 | A | 2/1991 | Parmley |
| 5,345,779 | A | 9/1994 | Feeney |
| 5,953,930 | A | 9/1999 | Chu |
| 7,011,576 | B2 | 3/2006 | Sharp |
| 7,051,802 | B2 * | 5/2006 | Baer .................. H05K 7/20609 165/299 |

(Continued)

FOREIGN PATENT DOCUMENTS

CN 1543758 A1 11/2004
CN 1732727 A1 2/2006
(Continued)

OTHER PUBLICATIONS

International Search Report and Written Opinion issued in International Application No. PCT/US2018/017577, dated May 28, 2018, 13 pages.

Primary Examiner — Zachary M Pape
(74) Attorney, Agent, or Firm — Fish & Richardson P.C.

(57) ABSTRACT

A data center cooling system includes a server rack frame assembly that includes a plurality of bays defined along a lengthwise dimension of the frame assembly, each bay including a volume defined at least in part by a specified height that is orthogonal to the lengthwise dimension and a specified width that is parallel to the lengthwise dimension and sized to at least partially enclose at least one server rack configured to support a plurality of data center computing devices; and at least one cooling unit sized for a bay of the plurality of bays of the server rack frame assembly and configured to circulate a heated airflow from an open back side of the at least one server rack, cool the heated air, and circulate a cooling airflow through an open front side of the at least one server rack.

42 Claims, 8 Drawing Sheets

(56) References Cited

U.S. PATENT DOCUMENTS

| | | | |
|---|---|---|---|
| 8,477,489 B2* | 7/2013 | Lin | H05K 7/20745 |
| | | | 165/104.33 |
| 8,763,414 B2 | 7/2014 | Carlson | |
| 9,357,671 B2* | 5/2016 | Long | F24F 1/0059 |
| 2002/0055329 A1 | 5/2002 | Storck | |
| 2004/0223300 A1 | 11/2004 | Fink et al. | |
| 2005/0170770 A1 | 8/2005 | Johnson | |
| 2007/0171613 A1 | 7/2007 | McMahan | |
| 2007/0281639 A1 | 12/2007 | Clidaras | |
| 2008/0164764 A1 | 7/2008 | So | |
| 2008/0164794 A1 | 7/2008 | Lai | |
| 2009/0241578 A1 | 10/2009 | Carlson | |
| 2010/0291855 A1 | 11/2010 | Nonn et al. | |
| 2011/0063778 A1* | 3/2011 | Brouillard | H05K 7/20645 |
| | | | 361/678 |
| 2011/0239679 A1 | 10/2011 | Dechene et al. | |
| 2011/0271695 A1* | 11/2011 | Kashirajima | G06F 1/206 |
| | | | 62/62 |
| 2013/0300266 A1* | 11/2013 | Ramey | A47B 87/0276 |
| | | | 312/111 |
| 2015/0334878 A1* | 11/2015 | Long | H05K 7/20781 |
| | | | 361/679.49 |

FOREIGN PATENT DOCUMENTS

| | | |
|---|---|---|
| EP | 2986091 | 2/2016 |
| JP | 11148710 A1 | 6/1999 |
| JP | 2003035441 A1 | 2/2003 |
| WO | WO2007139560 A1 | 12/2007 |
| WO | WO2009146040 A1 | 12/2009 |

* cited by examiner

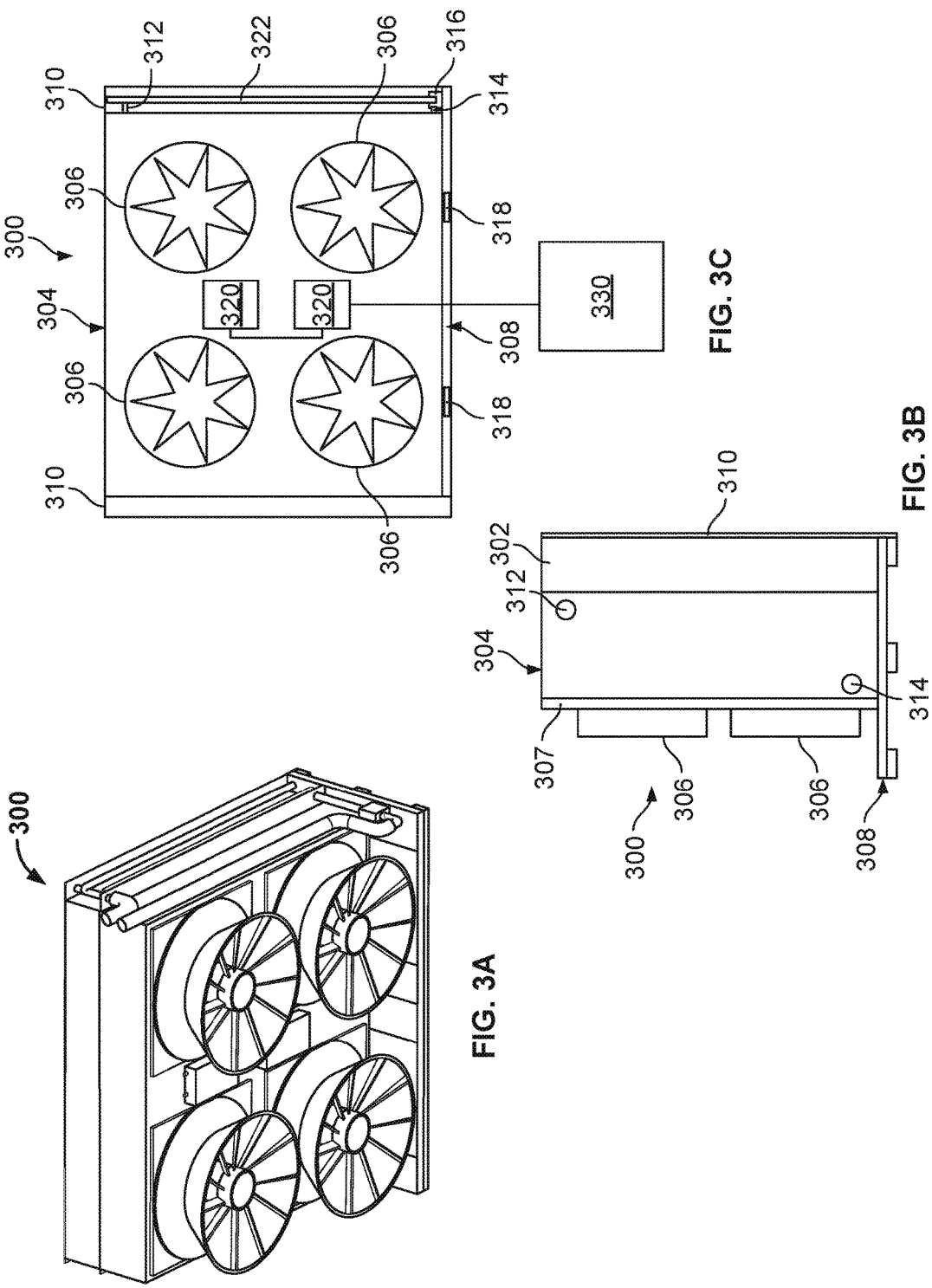

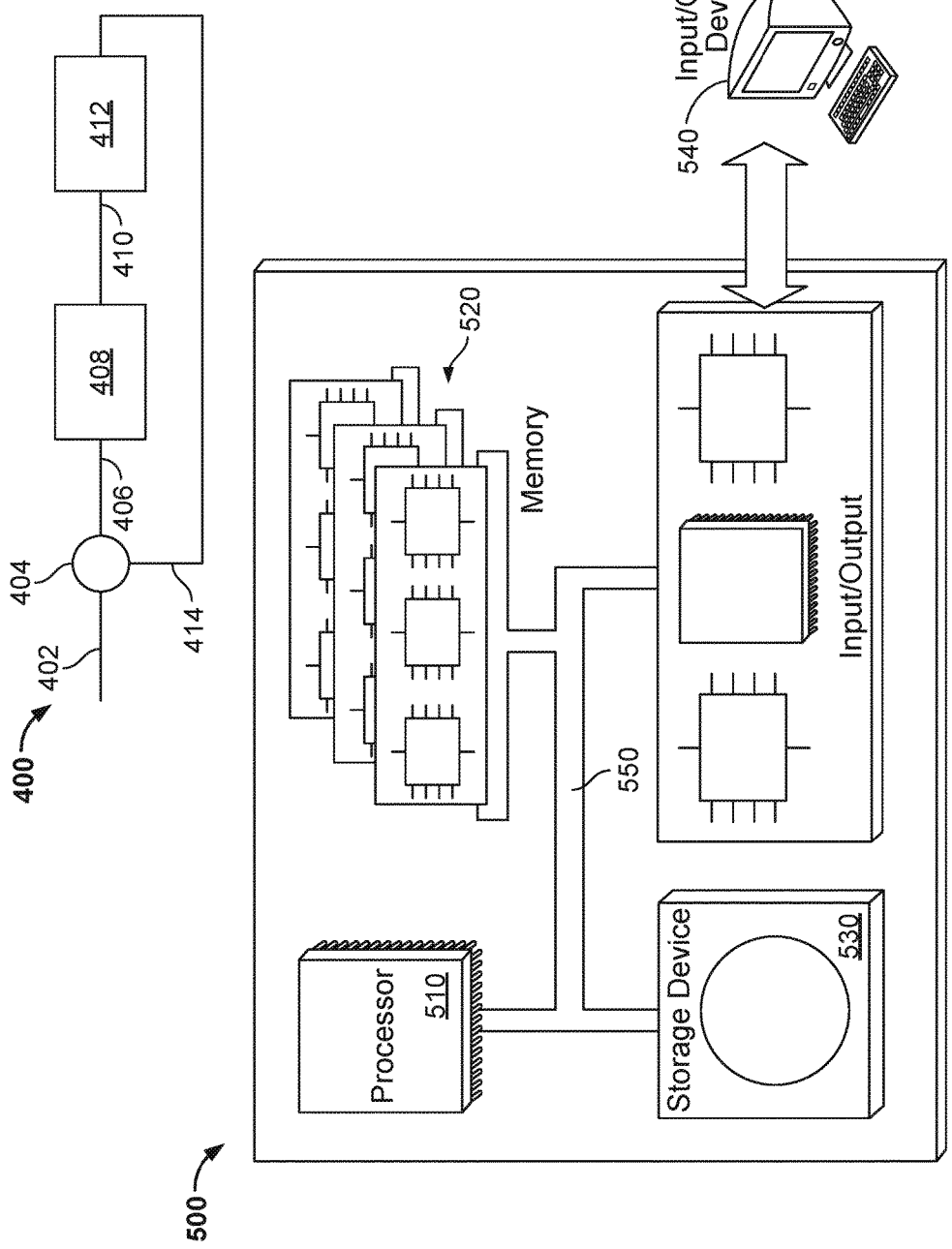

US 10,123,461 B2

COOLING ELECTRONIC DEVICES IN A DATA CENTER WITH COOLING UNITS MOUNTED IN BAYS OF A SERVER RACK FRAME ASSEMBLY

TECHNICAL FIELD

The present disclosure relates to systems and methods for cooling a data center and, more particularly, cooling electronic devices in a data center.

BACKGROUND

Electronics, such as servers and networking devices, in a data center generate heat that, if not dissipated or removed, can cause problems, including failure of such devices. In some cases, determining a proper size for cooling equipment for removing the heat may be difficult. For example, during a lifetime operation of a data center (e.g., decades), electronics platforms can go through multiple generations or refreshes. Therefore, correctly sizing the cooling equipment for any particular operational time period, while also accounting for other operational time periods (e.g., in the future) of the data center may be difficult.

SUMMARY

In a general implementation, a data center cooling system includes a server rack frame assembly that includes a plurality of bays defined along a lengthwise dimension of the frame assembly, each bay including a volume defined at least in part by a specified height that is orthogonal to the lengthwise dimension and a specified width that is parallel to the lengthwise dimension and sized to at least partially enclose at least one server rack configured to support a plurality of data center computing devices; and at least one cooling unit sized for a bay of the plurality of bays of the server rack frame assembly and configured to circulate a heated airflow from an open back side of the at least one server rack, cool the heated air, and circulate a cooling airflow through an open front side of the at least one server rack.

In an aspect combinable with the general implementation, the specified width and the specified height of the bay are based on a form factor of the at least one server rack.

In another aspect combinable with any of the previous aspects, at least one perimeter dimension of the cooling unit is based on a form factor of the at least one server rack.

In another aspect combinable with any of the previous aspects, the at least one server rack includes two server racks, each of the two server racks providing between 5 kW and 60 kW of computing power.

In another aspect combinable with any of the previous aspects, the at least one perimeter dimension includes a cooling unit width and a cooling unit height.

In another aspect combinable with any of the previous aspects, the cooling unit includes a cooling module; and at least one fan positioned to circulate heated airflow through the cooling module.

In another aspect combinable with any of the previous aspects, the cooling module includes an air-to-liquid heat exchanger.

In another aspect combinable with any of the previous aspects, the cooling unit further includes a modulating valve fluidly coupled to at least one of a fluid inlet or a fluid outlet of the air-to-liquid heat exchanger.

In another aspect combinable with any of the previous aspects, the plurality of bays are arranged in a first row of bays and a second row of bays that is positioned vertically above the first row of bays.

In another aspect combinable with any of the previous aspects, the plurality of bays are further arranged in a third row of bays that is positioned vertically above the second row of bays.

In another aspect combinable with any of the previous aspects, the server rack frame assembly includes a first portion that defines the first row of bays; a second portion stacked on top of the first portion that defines the second row of bays; and a third portion stacked on top of the second portion that defines the third row of bays.

In another general implementation, a method of cooling a data center includes circulating, with at least one cooling unit, a cooling airflow from a human-occupiable workspace of a data center through an open front side of at least one server rack configured to support a plurality of data center computing devices, the at least one server rack positioned in one of the bays of a plurality of bays of a server rack frame assembly that are defined along a lengthwise dimension of the frame assembly, each bay including a volume defined at least in part by a specified height that is orthogonal to the lengthwise dimension and a specified width that is parallel to the lengthwise dimension and sized to at least partially enclose the at least one server rack, the at least one cooling unit sized for one of the bays of the plurality of bays of the server rack frame assembly; circulating, with the at least one cooling unit, a heated airflow that includes heat from the plurality of data center computing devices through an open back side of the at least one server rack into a warm air aisle arranged adjacent the frame assembly; circulating, with the at least one cooling unit, the heated airflow from the warm air aisle and through the at least one cooling unit to cool the heated airflow; and circulating the cooling airflow from the at least one cooling unit into the human occupiable workspace.

In an aspect combinable with the general implementation, the specified width and the specified height of the bay are based on a form factor of the at least one server rack, and the at least one perimeter dimension of the cooling unit is based on the form factor of the at least one server rack.

Another aspect combinable with any of the previous aspects further includes cooling the heated air with an air-to-liquid heat exchanger of the cooling unit; and controlling a flow of a cooling liquid to the air-to-liquid heat exchanger with a modulating valve that is fluidly coupled to at least one of a fluid inlet or a fluid outlet of the air-to-liquid heat exchanger.

In another aspect combinable with any of the previous aspects, the plurality of bays are arranged in a first row of bays and a second row of bays that is positioned vertically above the first row of bays.

Another aspect combinable with any of the previous aspects further includes circulating the heated airflow from the at least one server rack that is mounted in one of the bays in the first row of bays to the at least one cooling unit that is mounted in one of the bays in the second row of bays; and circulating the cooling airflow, with the at least one cooling unit that is mounted in the one of the bays in the second row of bays, from the human-occupiable workspace through the at least one server rack that is mounted in the one of the bays in the first row of bays.

Another aspect combinable with any of the previous aspects further includes circulating the heated airflow from the at least one server rack that is mounted in one of the bays in the first row of bays to the at least one cooling unit that is mounted in one of the bays in the second row of bays that is positioned vertically above the one of the bays in the first row of bays; and circulating the cooling airflow, with the at least one cooling unit that is mounted in the one of the bays in the first row of bays, from the human-occupiable workspace through the at least one server rack that is mounted in the one of the bays in the first row of bays.

Another aspect combinable with any of the previous aspects further includes selecting the at least one cooling unit based at least in part on an expected heat output of the at least one server rack and a cooling capacity of the at least one cooling unit.

In another aspect combinable with any of the previous aspects, the at least one server rack includes a plurality of server racks.

Another aspect combinable with any of the previous aspects further includes adjusting a power density of the plurality of server racks; and based on the adjusted power density, adjusting a cooling capacity of the at least one cooling unit.

In another aspect combinable with any of the previous aspects, adjusting a power density of the plurality of server racks includes at least one of adding a specified number of server racks to the plurality of server racks; removing a specified number of server racks from the plurality of server racks; or replacing at least a portion of the plurality of server racks with another portion of server racks that include an increased or reduced power density of the replaced portion of the plurality of server racks.

In another aspect combinable with any of the previous aspects, the at least one cooling unit includes a plurality of cooling units, and adjusting the cooling capacity of the at least one cooling unit includes at least one of adding a specified number of cooling units to the plurality of cooling units; removing a specified number of cooling units from the plurality of cooling units; or replacing at least a portion of the plurality of cooling units with another portion of cooling units that include an increased or reduced cooling capacity of the replaced portion of the plurality of cooling units.

In another general implementation, a data center cooling system includes at least two rows of server racks positioned within a data center building. Each row includes a server rack frame assembly that includes a plurality of bays defined along a lengthwise dimension of the frame assembly, each bay including a volume defined at least in part by two specified dimensions, where the plurality of bays include a first portion of bays within the frame assembly along the lengthwise dimension at a first level and a second portion of bays within the frame assembly along the lengthwise dimension at a second level above the first level; a plurality of server racks configured to support a plurality of data center computing devices, at least one server rack positioned in a bay in the first portion of bays and at least another server rack positioned in a bay in the second portion of bays; and at plurality of cooling units, each sized for a bay of the plurality of bays of the server rack frame assembly, at least one cooling unit positioned in a bay in the first portion of bays and at least another cooling unit positioned in a bay in the second portion of bays. The system further includes a control system communicably coupled to the plurality of cooling units, the control system configured to control the plurality of cooling units to perform operations including circulating a heated airflow from open back sides of the plurality of server racks through the plurality of cooling units; cooling, in the plurality of cooling units, the heated air; and circulating a cooling airflow through open front sides of the at plurality of server racks.

In an aspect combinable with the general implementation, the two specified dimensions include a specified height that is orthogonal to the lengthwise dimension and a specified width that is parallel to the lengthwise dimension.

In another aspect combinable with any of the previous aspects, the two specified dimensions are based on a form factor of a particular server rack of the plurality of server racks.

In another aspect combinable with any of the previous aspects, each cooling unit includes at least one cooling coil fluidly coupled to a cooling liquid junction of a plurality of cooling liquid junctions.

In another aspect combinable with any of the previous aspects, each cooling liquid junction fluidly coupled to a source of a cooling liquid and to two or more cooling coils.

In another aspect combinable with any of the previous aspects, each cooling unit further includes a modulating valve fluidly coupled to at least one of a fluid inlet or a fluid outlet of the cooling coil.

In another aspect combinable with any of the previous aspects, the plurality of bays are further arranged in a third portion of bays that is positioned vertically above the second portion of bays.

In another aspect combinable with any of the previous aspects, the server rack frame assembly includes a first frame sub-assembly that defines the first portion of bays; a second frame sub-assembly stacked on top of the first portion that defines the second portion of bays; and a third frame sub-assembly stacked on top of the second portion that defines the third portion of bays.

Implementations according to the present disclosure may include one or more of the following features. For example, implementations of a data center cooling system according to the present disclosure may provide for a match or substantial match of cooling capacity to heat load from information technology (IT) equipment in a data center. Also, the data center cooling system may, by matching or substantially matching cooling capacity to heat load, operate at a highest efficiency. As another example, electrical power and cost overhead may be reduced while improving power usage effectiveness (PUE) (i.e., a ratio of an amount of electrical power used to power IT equipment in a data center and total amount of electrical power used by the data center). As a further example, implementations of a data center cooling system according to the present disclosure may include one or more cooling modules that need not be preinstalled in an entirety of a data center building prior to IT equipment deployment and, instead, may be installed stepwise with deployment (or redeployment) of the IT equipment. For example, cooling equipment may be deployed along with deployment of a zone (e.g., group, row, cluster, or otherwise) of IT equipment, such as server racks that hold multiple computing devices.

Implementations according to the present disclosure may also include one or more of the following features. In some examples, "as needed" deployment of the cooling equipment (e.g., only when deployment or redeployment of IT equipment requires) may accelerate a data center construction or data center start-up process, reducing the time to bring up services in a data center, which has substantial financial advantages (e.g., lower/shorter committed capital expense). "As needed" deployment of cooling equipment may also enable flexibility through the life of the data center to readjust cooling capacity with changes to IT equipment (e.g., server racks and other equipment) without impacting the operation and production loads. As yet another example, a data center cooling system according to the present disclosure may enable increased flexibility and usage of a total volume of workspace (e.g., human-occupiable, IT equipment occupiable), including volume above a conventional human work zone (e.g., up to 6-8 feet) of a data center. As yet another example, a data center cooling system according to the present disclosure may allow for increased flexibility of an arrangement and rearrangement of IT equipment (e.g., server racks) and cooling units by standardizing a space required for both server racks and cooling units. Further, a data center cooling system according to the present disclosure may facilitate additional cooling expansion that could enable power-dense payload technologies relative to convention server rack payloads. Also, a data center cooling system according to the present disclosure facilitates upgrades and specialized cooling modules depending on technical requirements of the payload.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

FIGS. 3A-3C are schematic illustrations of an isometric, front, and side view, respectively, of an example implementation of a cooling unit that may be used in either of the data center systems of FIGS. 1A-1C or FIGS. 2A-2C.

FIG. 4 illustrates an example control loop for controlling a data center cooling unit according to the present disclosure.

FIG. 5 is a schematic illustration of an example controller for a data center cooling system according to the present disclosure.

DETAILED DESCRIPTION

Figure 1A:
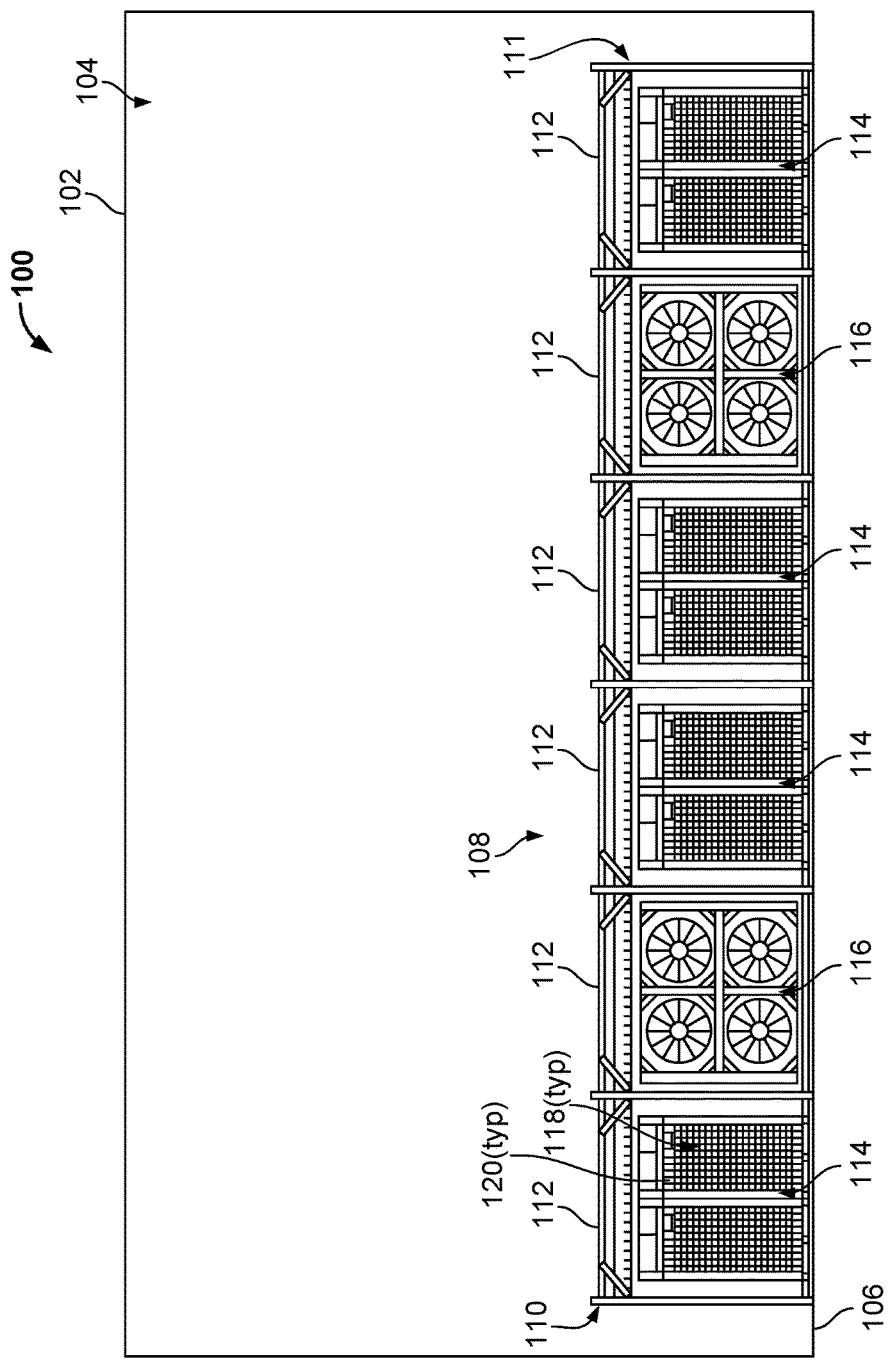
FIGS. 1A-1C are schematic illustrations of a side, top, and end view, respectively, of an example implementation of a data center system that includes a single, mixed computing and cooling layer according to the present disclosure.

Data center systems according to the present disclosure may comprise one or more layers of mixed computing/cooling equipment. In some aspects, the layers comprise rows of server rack frame assembly structures that support (e.g., enclose or hold) server racks that support computer server devices. In the case of multiple layers, the layers may be stacked to form stacked rows of mixed computing/cooling equipment. In some aspects, data center systems according to the present disclosure may provide a scalable modular cooling scheme for a data center, which could be deployed (and redeployed, and rearranged) throughout the life of a data center.

In some aspects of data center systems described in the present disclosure, cooling units within the layer(s) of mixed computing/cooling equipment may comprise a form factor (e.g., external dimensions, overall shape, size) that is the same as or substantially similar to (e.g., within inches or less of) a server rack that fits within the layer(s) of mixed computing/cooling equipment. In some aspects, the similar or identical "form factor" of the cooling unit may also include similar power (e.g., voltage, wattage), mechanical considerations (e.g., weight, connections within the frame assembly), network (e.g., type of communication interface), and telemetry (e.g., sensors, control equipment) as a server rack, thereby making a particular cooling unit interchangeable (all or substantially) within a particular space (e.g., bay of a frame assembly) with a particular server rack. Thus, a cooling unit may be installed in any appropriate volume of the server rack frame assembly in place of a server rack.

In particular implementations, a cooling unit that operates within the layer(s) of mixed computing/cooling equipment may use a cooling liquid (e.g., chilled water or chilled glycol from one or more chillers, condenser water or other evaporatively cooled liquid, or otherwise) from a data center building central plant. The cooling unit utilizes the cooling liquid in an air-to-liquid heat exchanger (e.g., liquid or refrigerant cooling coil) to cool a flow of heated air from multiple server racks. The cooling unit may include one or more fans that are controllably operated to circulate the heated airflow from the server racks to the cooling unit, through the air-to-liquid heat exchanger to cool the heated airflow, and from the cooling unit (as a cooling airflow) back, to the server racks.

The layer(s) of mixed computing/cooling equipment may be deployed in a data center building in an incremental process. For example, an initial amount of IT power load (that generates a particular heat load) may be determined. For an initial deployment, the IT power load may be in a single zone (e.g., row, cluster) or in or in multiple zones (e.g., multiple rows, multiple clusters, multiple layers of rows or clusters). Based on the determined IT power load (and corresponding heat load), cooling capacity (e.g., per zone) may be determined, thereby determining a number of cooling units needed per zone (e.g., based on a maximum cooling capacity per cooling unit). IT equipment (e.g., server racks) may be deployed in the data center (e.g., within server rack frame assemblies arranged in one or more vertical layers) along with the determined number of cooling units (also within the server rack frame assemblies arranged in one or more vertical layers). For example, the cooling modules may be deployed interspersed in between server racks within the frame assembly, e.g., in particular locations (e.g., bays) to account for cooling requirements dictated by the server rack placements.

The initial deployment process described above can be iterative and repeated for technology refreshes (e.g., replacement of particular server racks with other, higher/lower power server racks) or new deployments (e.g., addition of server racks). In each iteration, based on the iteratively determined IT load (and corresponding determined heat load), a number and/or location of cooling units can be re-calculated. For example, if low powered server racks are being replaced with higher (relatively) powered server racks to increase a server rack power density of the data center or zone of the data center, the cooling capacity may be recalculated and cooling units can be added for the additional cooling power. Similarly, cooling units could be removed when server rack power density is reduced in the data center or zone of the data center. With incrementally deployed cooling units, cooling could be "as needed" and properly sized based on the deployed IT equipment in each zone (e.g., single layer row, portion of a single layer row, multi-layer row, or portion of a multi-layer row). For example, for low power density server racks, fewer cooling units may be deployed within a particular zone, while a larger number of cooling units may be needed for high power density server racks within a particular zone.

Incremental, mixed computing/cooling equipment deployment can be implemented in different data center equipment architectures. For example, although the present disclosure describes single and multi-level row-based architectures, other, non-linear architectures (e.g., single or multi-level clusters) can also be implemented according to the present disclosure. Further, although layers of mixed computing/cooling equipment architectures are shown, the cooling equipment may be extracted from the layers of computing equipment and implemented, e.g., as overhead cooling, underfloor cooling, end of row cooling, conventional CRAC cooling, or otherwise.

Figure 1B:
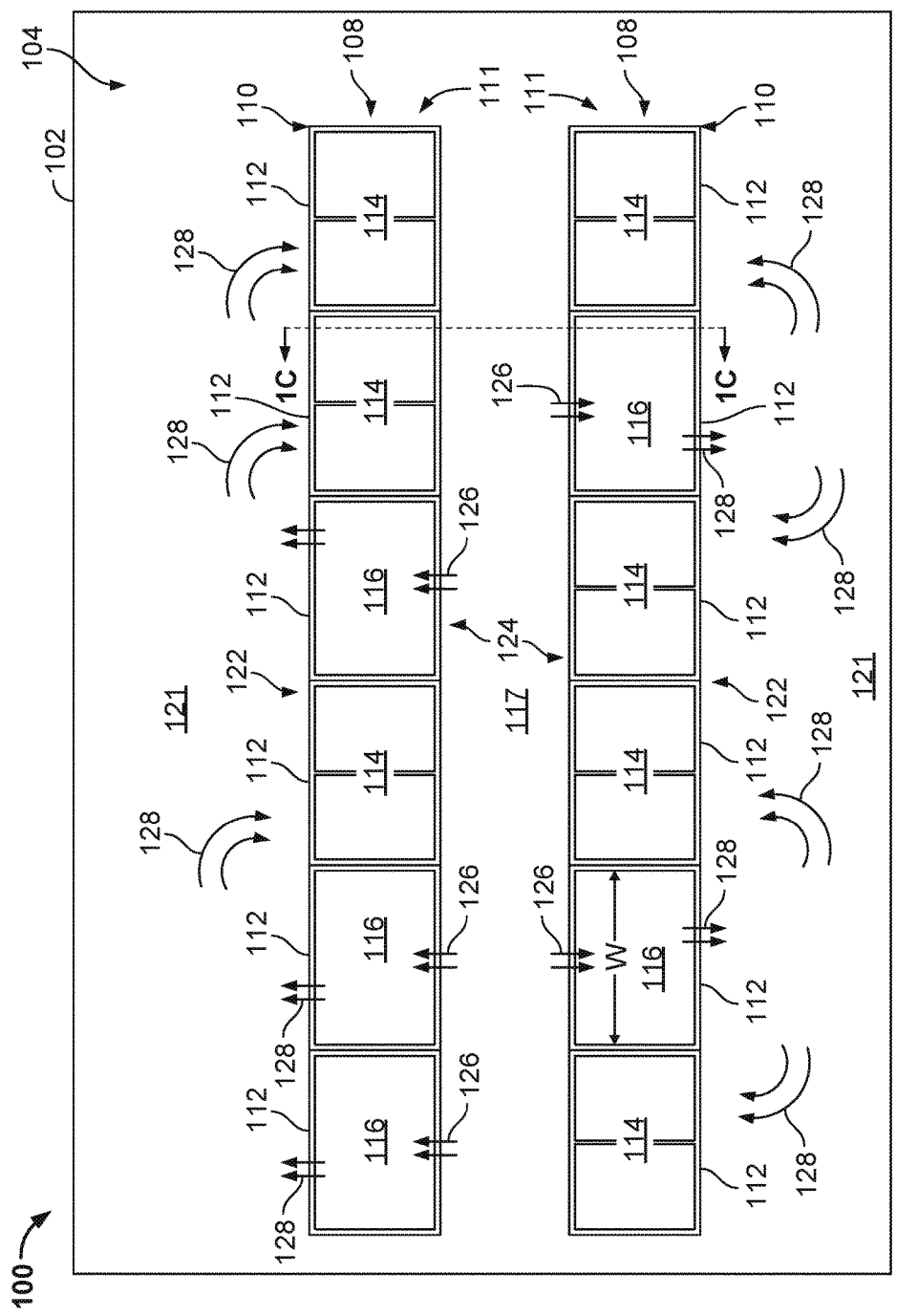
Figure 1C:
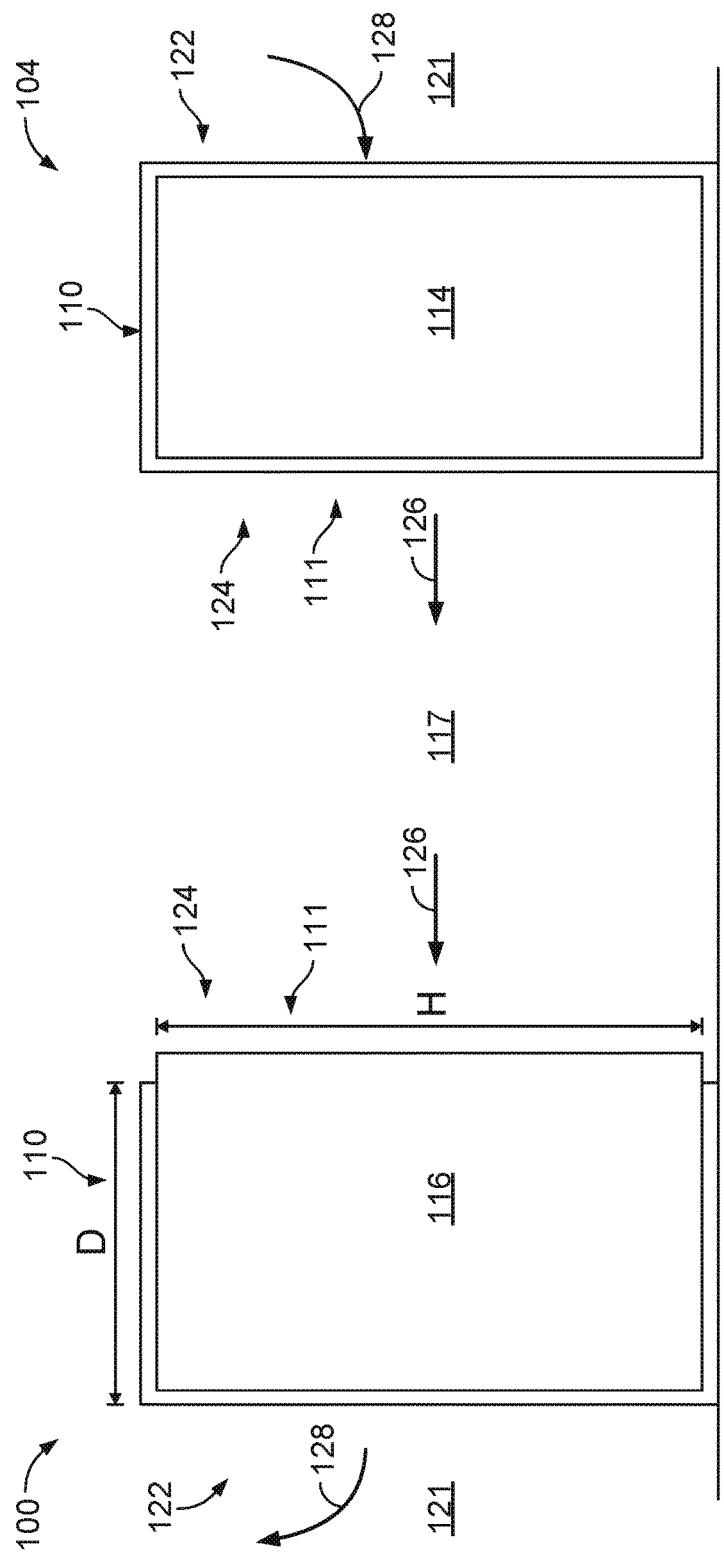

FIGS. 1A-1C are schematic illustrations of a side, top, and end view, respectively, of an example implementation of a data center system 100 that includes a single, mixed computing and cooling layer 111 positioned in a human-occupiable workspace 104 of a data center building 102. As shown in this example implementation, the data center system 100 includes a layer 111 of server racks 114 and cooling units 116 that are positioned in a server rack frame assembly 110. In this example, the layer 111 is arranged in a row 108 (e.g., linear or substantially linear arrangement of the server rack frame assembly 110). In alternative arrangements, the layer 111 may be arranged in a non-linear frame assembly, such as, for instance, a circular or partially circular frame assembly or otherwise.

The server rack frame assembly 110 comprises structural members (e.g., metal or non-metal, such as composite) arranged and connected to form multiple bays 112 in the frame assembly 110. Each bay 112, in this example implementation, defines a volume within the frame assembly 110 and may be the same or similar in volume and perimeter dimensions (e.g., height "H", width "W", and depth "D") as the other bays 112 in the layer 111 of the server rack assembly 110. In some aspects, H may be about 10 feet, W may be about 10 feet, and D may be about 3 feet, as an exemplary set of dimensions.

In some aspects, the perimeter dimensions of the bays 112 (and thus the volumes defined by the bays 112) in the server rack frame assembly 110 are based on or associated with dimensions of the server racks 114. For example, in the illustrated implementations, each bay 112 is sized (e.g., at least W and H) according to dimensions of a double server rack 114 (i.e., two server racks of 42 U in height, two server racks of between 18-22 U in height, or other sized server racks). In some aspects, the server racks 114 may be 54 U in height, although server rack frame assembly 110 may handle a variation of rack sizes. For example, the racks 114 may be about 50 inches wide each.

Furthermore, different combinations of racks 114 can be used in the example implementation. For an example, four racks 114, each 24 inches in width, can be used within the server rack frame assembly 110. The racks 114 can also vary in depth. For example, the front faces of the server racks 114 may be flush with a front side 122 of the assembly 110, while a rear of the racks 114 may extend various depths beyond back sides 124 of the assembly 110.

As shown in FIG. 1A, the server racks 114 support electronic devices, such as processors, memory modules, networking switches, battery modules, and other server rack computing components, both physically by providing structure for the devices to be placed in and electrically by providing electric power to the devices from a main source of power (e.g., through an inverter, a transformer, or both). Generally, each illustrated server rack 114 may be one of a number of server racks within the data center building 102, which may include a server farm or a co-location facility that contains various rack mounted computer systems. Each server rack 114 may define multiple slots that are arranged in an orderly and repeating fashion within the server rack 114, and each slot is a space in the rack into which a corresponding server rack sub-assembly 118 can be placed and removed. For example, a server rack sub-assembly 118 can be supported on rails that project from opposite sides of the rack 114, and which can define the position of the slots. Also, although multiple server rack sub-assemblies 118 are illustrated as mounted within the rack 114, there might be only a single server rack sub-assembly.

The slots, and the server rack sub-assemblies 114, can be oriented with the illustrated horizontal arrangement (with respect to gravity) as shown in FIG. 1A. Alternatively, the slots, and the server rack sub-assemblies 118, can be oriented vertically (with respect to gravity). Where the slots are oriented horizontally, they may be stacked vertically in the rack 114, and where the slots are oriented vertically, they may be stacked horizontally in the rack 114.

Server rack 114, as part of a larger data center for instance, may provide data processing and storage capacity. In operation, a data center may be connected to a network, and may receive and respond to various requests from the network to retrieve, process, and/or store data. In operation, for example, the server rack 114 typically facilitates the communication of information over a network with user interfaces generated by web browser applications of users who request services provided by applications running on computers in the datacenter. For example, the server rack 114 may provide or help provide a user who is using a web browser to access web sites on the Internet or the World Wide Web.

The server rack sub-assembly 118 may be one of a variety of structures that can be mounted in a server rack 114. For example, in some implementations, the server rack sub-assembly 118 may be a "tray" or tray assembly that can be slidably inserted into the server rack 114. The term "tray" is not limited to any particular arrangement, but instead applies to motherboard or other relatively flat structures appurtenant to a motherboard for supporting the motherboard in position in a rack structure. In some implementations, the server rack sub-assembly 118 may be a server chassis, or server container (e.g., server box). In some implementations, the server rack sub-assembly 118 may be a hard drive cage.

Each server rack sub-assembly 118 can include a frame or cage, a printed circuit board, e.g., motherboard, supported on the frame, and one or more electronic devices 120, e.g., a processor or memory, mounted on the printed circuit board. The electronic devices 120 can include, for instance, processors, memories, hard drives, network switches, or other IT components. Other appurtenances, such as cooling devices, fans, uninterruptible power supplies (UPS) (e.g., battery modules) can be mounted to the server rack sub-assembly 118 (or otherwise to a rack 114).

With respect specifically to FIG. 1A, the cooling units 116 are positioned adjacent the server racks 114 in the bays 112. In some aspects, each cooling unit 116 may comprise a form factor (e.g., dimensions such as width and height) that is similar to or the same as a form factor (e.g., dimensions such as width and height) of the server racks 114. In some aspects, while a width and a height of the cooling units 116 are the same as or similar to the width and height, respectively, of the server racks 114, a depth of the cooling unit (e.g., as shown in FIG. 1B), may be different (e.g., larger) than a depth of the server racks 114. Thus, in some aspects, each cooling unit 116 may be positioned in any of the bays 112, and each server rack 114 may be positioned in any of the bays 112, thereby making the cooling units 116 and server racks 114 interchangeable within the server rack frame assembly 110.

In some aspects, the cooling units 116 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 116 may be stand-alone refrigerant-based (DX) cooling units fluidly coupled to one or more condensing units located external to the data center building 102 (e.g., conventionally known as "CRAC" units).

As show in more detail in FIGS. 1B-1C, a warm air aisle 117 is defined between adjacent rows 108 of server rack frame assemblies 110, with open back sides 124 of the server rack frame assemblies 110 facing the warm air aisle 117. Although only two rows 108 and one warm air aisle are shown in FIGS. 1B and 1C, the data center building 102 may house multiple rows 108 with warm air aisles 117 defined between pairs of rows 108 of the server rack frame assemblies 110. In this example implementation, the open back sides 124 of the frame assemblies 110 allow for airflow with minimal or no pressure gradient between the backs of the server racks 114 (which are also open) that face the warm air aisle 117 and the warm air aisle 117 itself. Similarly, the server rack frame assemblies 110 have, in this example, open front sides 122 that face the cool air aisles 121. The open front sides 122 of the frame assemblies 110 allow for airflow with minimal or no pressure gradient between the fronts of the server racks 114 (which are also open) that face the cool air aisle 121 and the cool air aisle 121 itself. Thus, in some aspects, an air pressure at the fronts and backs of the server racks 114, which are open to the aisles 121 and 117, respectively, are substantially equal or equal to an air pressure within the aisles 121 and 117, respectively.

In operation, the cooling units 116 circulate a cooling airflow 128 through the front sides 122 of the server racks 114 (e.g., that are open to the human-occupiable workspace 104. The cooling airflow 128 receives heat from electronic devices 120 in the racks 114 and warms the airflow 128 to a heated airflow 126 that enters the warm air aisle 117. The heated airflow 126 is drawn back into the cooling units 116 (e.g., by fans in the units 116) and cooled through the one or more cooling coils (e.g., by a flow of the chilled liquid, condenser water, refrigerant, or an electrically-powered cooler such as a Peltier cooler). The cooled airflow 128 is circulated (e.g., by the fans) back into the human-occupiable workspace 104 adjacent the front sides 122 of the server racks 114 and server rack frame assemblies 110.

Figure 2A:
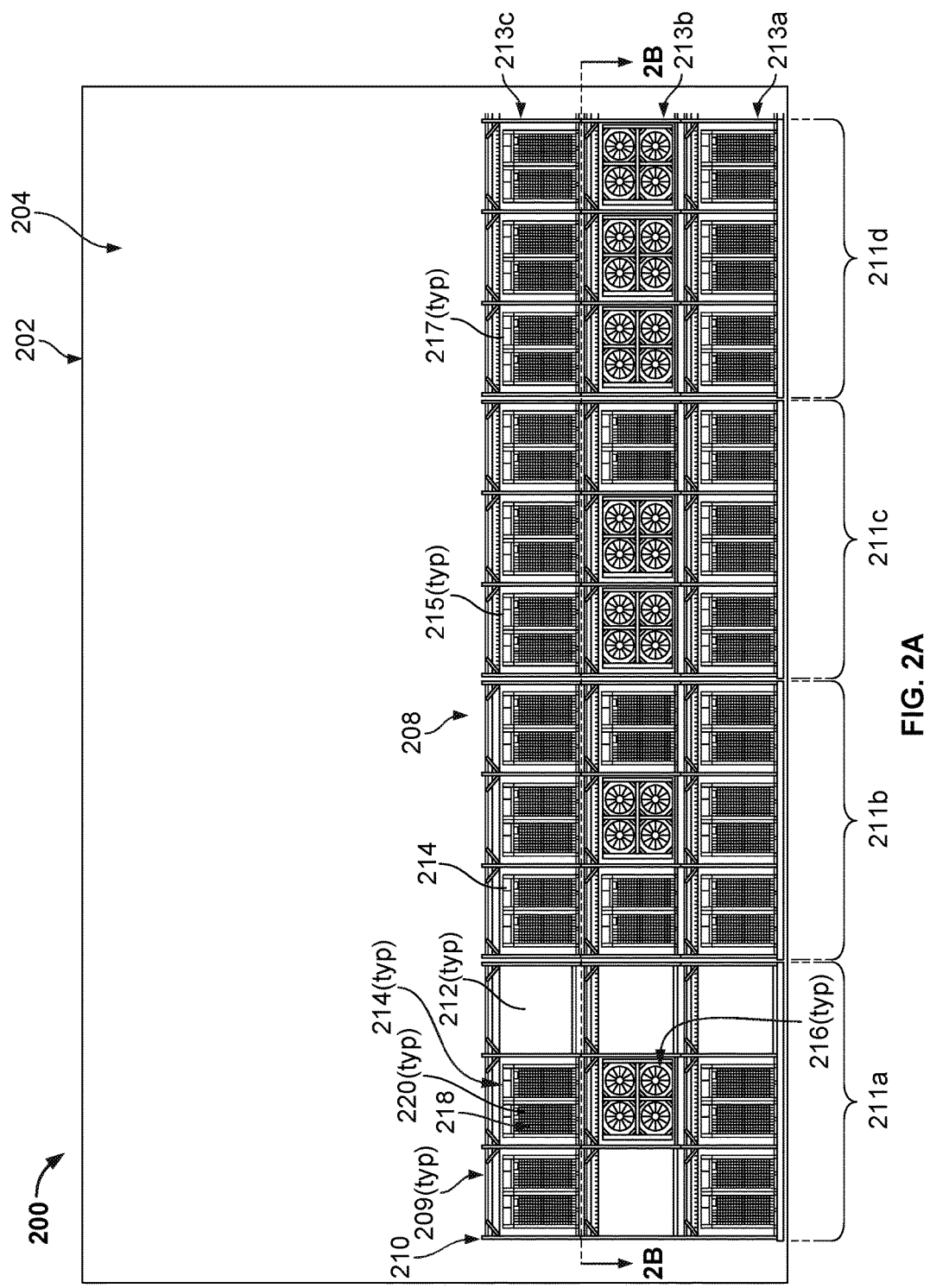
FIGS. 2A-2C are schematic illustrations of a side, top, and end view, respectively, of an example implementation of a data center system that includes multiple, mixed computing and cooling layers according to the present disclosure.
Figure 2B:
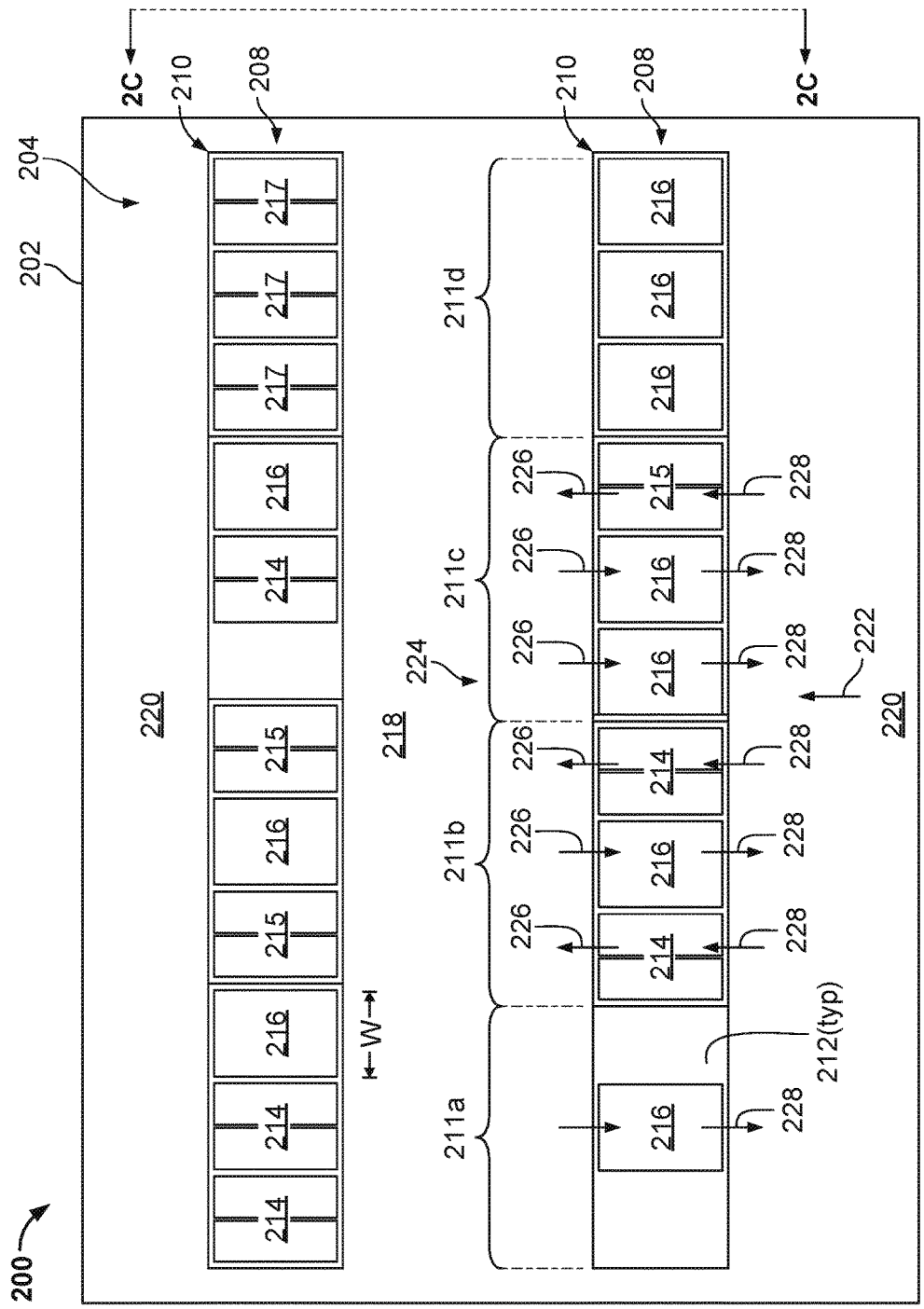
Figure 2C:
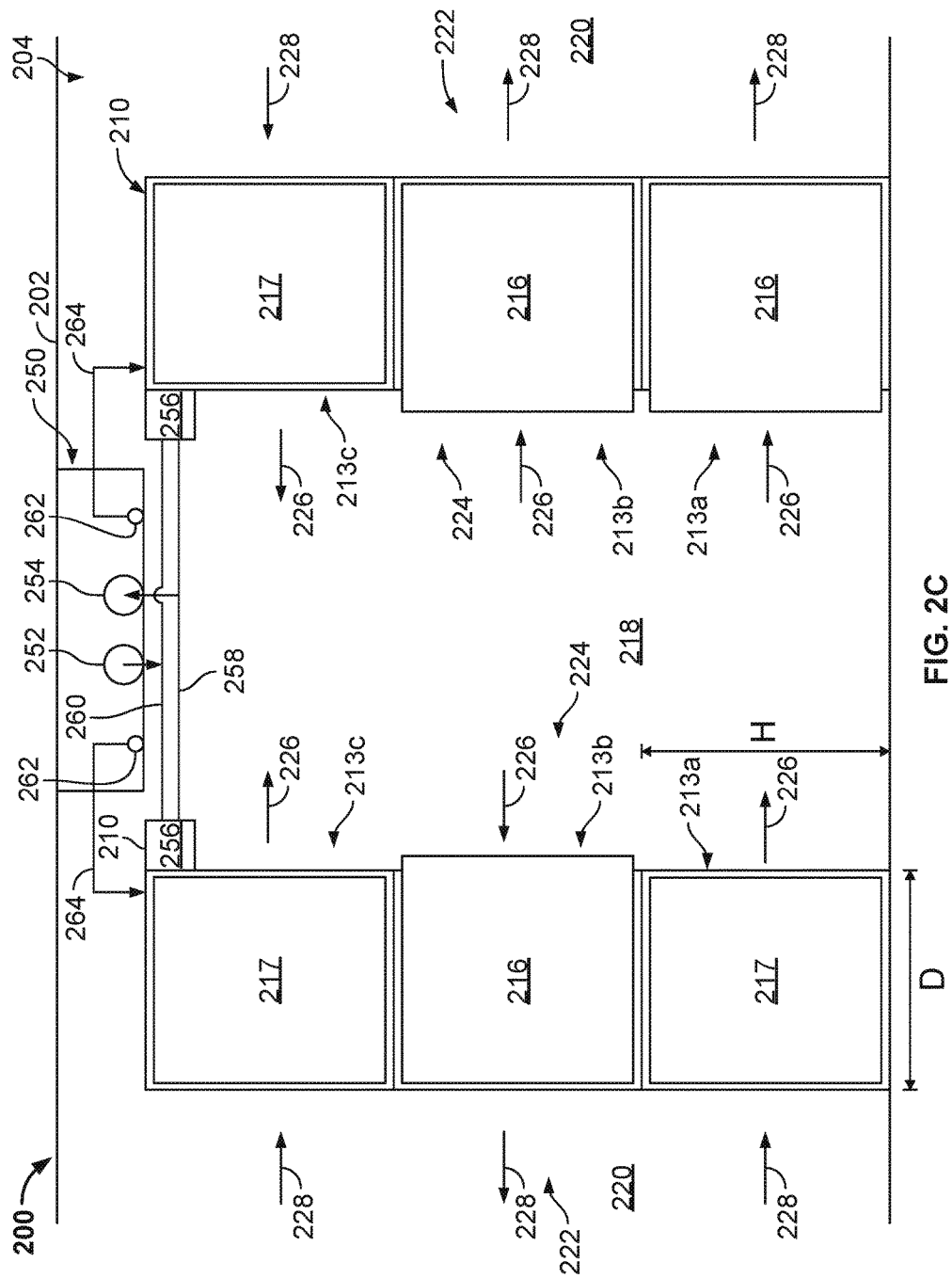

FIGS. 2A-2C are schematic illustrations of a side, top, and end view, respectively, of an example implementation of a data center system 200 that includes multiple, stacked and mixed computing and cooling layers 213a-213c positioned in a human-occupiable workspace 204 of a data center building 202. As shown in this example implementation, the data center system 200 includes three layers 213a-213c of server racks 214 (or server racks 215 or server racks 217) and cooling units 216 that are positioned in a server rack frame assembly 210. In this example, the layers 213a-213c are arranged in a row 208 (e.g., linear or substantially linear arrangement of the server rack frame assembly 210). In alternative arrangements, the layers 213a-213c may be arranged in a non-linear frame assembly, such as, for instance, a circular or partially circular frame assembly or otherwise. Although three layers 213a-213c are shown in this example, fewer (e.g., two) or more layers may be implemented without departing from the scope of the present disclosure.

The server rack frame assembly 210 comprises structural members (e.g., metal or non-metal, such as composite) arranged and connected to form multiple bays 212 in the frame assembly 210. Each bay 212, in this example implementation, defines a volume within the frame assembly 210 and may be the same or similar in volume and perimeter dimensions (e.g., height "H" of 10 feet, width "W" of 10 feet, and depth "D" of 3 feet) as the other bays 212 in the layer 213 of the server rack frame assembly 210. In some aspects, the perimeter dimensions of the bays 212 (and thus the volumes defined by the bays 212) in the server rack frame assembly 210 are based on or associated with dimensions of the server racks 214 (or 215 or 217). For example, in the illustrated implementations, each bay 212 is sized (e.g., at least 10' W and 10' H) according to dimensions of a double server rack 214 (or 215 or 217) (i.e., two server racks of 42 U in height, two server racks of between 18-22 U in height, or other sized server racks). In some aspects, the server racks 214 (or 215 or 217) may be 54 U in height, although server rack frame assembly 110 may handle a variation of rack sizes. For example, the racks 214 (or 215 or 217) may be about 50 inches wide each.

Furthermore, different combinations of racks 214 (or 215 or 217) can be used in the example implementation. For an example, four racks 214 (or 215 or 217), each 24 inches in width, can be used within the server rack frame assembly 210. The racks 214 (or 215 or 217) can also vary in depth. For example, the front faces of the server racks 214 (or 215 or 217) may be flush with a front sides of the assembly 210, while a rear of the racks 214 (or 215 or 217) may extend various depths beyond back sides of the assembly 210.

As shown in FIG. 2A, groups of bays 212 may be arranged to form columns 209 (e.g., a vertical group of three stacked bays 212). The bays 212 may be further grouped, in this example, in clusters 211a-211d of bays 212 that include a multi-dimensional (e.g., vertical and horizontal) grouping of bays 212. In this example implementation, clusters 211a-211d are shown as three by three (e.g., three columns 209 of bays 212 by three layers 213 of bays 212) groupings of nine total bays 212. In some aspects, a column 209 or cluster 211 of bays 212 may be part of a power, cooling liquid, or network sharing architecture. For example, in some aspects, separate electrical power conductors may provide electrical power to the server racks 214 (or 215 or 217) and cooling units 216 that are positioned in separate columns 209 or clusters 211 of bays 212, e.g., to ensure that a failure of one power conductor only affects the racks 214 (or 215 or 217) and/or cooling units 216 in that particular column 209 or cluster 211. Likewise, in some aspects, separate cooling liquid conduits may provide a cooling liquid to the cooling units 216 that are positioned in separate columns 209 or clusters 211 of bays 212, e.g., to ensure that a failure of one cooling liquid conduit only affects the cooling units 216 in that particular column 209 or cluster 211. Further, in some aspects, separate networking connectors may provide data communication to the server racks 214 (or 215 or 217) that are positioned in separate columns 209 or clusters 211 of bays 212, e.g., to ensure that a failure of one network connector only affects the racks 214 (or 215 or 217) in that particular column 209 or cluster 211.

As shown in FIG. 2A, the server racks 214 (or 215 or 217) support electronic devices, such as processors, memory modules, networking switches, battery modules, and other server rack computing components, both physically by providing structure for the devices to be placed in and electrically by providing electric power to the devices from a main source of power (e.g., through an inverter, a transformer, or both). Generally, each illustrated server rack 214 (or 215 or 217) may be one of a number of server racks within the data center building 202, which may include a server farm or a co-location facility that contains various rack mounted computer systems. Each server rack 214 (or 215 or 217) may define multiple slots that are arranged in an orderly and repeating fashion within the server rack 214 (or 215 or 217), and each slot is a space in the rack into which a corresponding server rack sub-assembly 218 can be placed and removed. For example, a server rack sub-assembly 218 can be supported on rails that project from opposite sides of the rack 214 (or 215 or 217), and which can define the position of the slots. Also, although multiple server rack sub-assemblies 218 are illustrated as mounted within the rack 214 (or 215 or 217), there might be only a single server rack sub-assembly.

The slots, and the server rack sub-assemblies 214, can be oriented with the illustrated horizontal arrangement (with respect to gravity) as shown in FIG. 2A. Alternatively, the slots, and the server rack sub-assemblies 218, can be oriented vertically (with respect to gravity). Where the slots are oriented horizontally, they may be stacked vertically in the rack 214 (or 215 or 217), and where the slots are oriented vertically, they may be stacked horizontally in the rack 214 (or 215 or 217).

Server rack 214 (or 215 or 217), as part of a larger data center for instance, may provide data processing and storage capacity. In operation, a data center may be connected to a network, and may receive and respond to various requests from the network to retrieve, process, and/or store data. In operation, for example, the server rack 214 (or 215 or 217) typically facilitates the communication of information over a network with user interfaces generated by web browser applications of users who request services provided by applications running on computers in the datacenter. For example, the server rack 214 (or 215 or 217) may provide or help provide a user who is using a web browser to access web sites on the Internet or the World Wide Web.

The server rack sub-assembly 218 may be one of a variety of structures that can be mounted in a server rack 214 (or 215 or 217). For example, in some implementations, the server rack sub-assembly 218 may be a "tray" or tray assembly that can be slidably inserted into the server rack 214 (or 215 or 217). The term "tray" is not limited to any particular arrangement, but instead applies to motherboard or other relatively flat structures appurtenant to a motherboard for supporting the motherboard in position in a rack structure. In some implementations, the server rack sub-assembly 218 may be a server chassis, or server container (e.g., server box). In some implementations, the server rack sub-assembly 218 may be a hard drive cage.

Each server rack sub-assembly 218 can include a frame or cage, a printed circuit board, e.g., motherboard, supported on the frame, and one or more electronic devices 220, e.g., a processor or memory, mounted on the printed circuit board. The electronic devices 220 can include, for instance, processors, memories, hard drives, network switches, or other IT components. Other appurtenances, such as cooling devices, fans, uninterruptible power supplies (UPS) (e.g., battery modules) can be mounted to the server rack sub-assembly 218 (or otherwise to a rack 214 (or 215 or 217)).

Server racks 214, server racks 215, and server racks 217, as shown, may be physically similar or identical (e.g., similar or identical height, width, depth, weight), but may provide different computing power and, thus, different heat output. For example, server racks 214 may be 15 kW racks, with electronic devices 220 that generate about 15 kW of heat each. Server racks 215 may be 30 kW racks, with electronic devices 220 that generate about 30 kW of heat each. Server racks 217 may be 60 kW racks, with electronic devices 220 that generate about 60 kW of heat each. Thus, in some aspects, a number and computing power of the particular racks (e.g., server racks 214, 215, and/or 217) within a particular layer 213a-213c, a particular column 209, or a particular cluster 211a-211d of bays 212 may dictate a number of cooling units 216 that are positioned within the particular layer 213a-213c, particular column 209, or particular cluster 211a-211d of bays 212. For example, the greater number of server racks 217 relative to server racks 214 within any particular layer, column, or cluster may dictate (e.g., due to cooling requirements for the heat generated by the electronic devices 220 in the racks) a greater number of cooling units 216 within the particular layer, column, or cluster. Conversely, the greater number of server racks 214 relative to server racks 217 within any particular layer, column, or cluster may dictate (e.g., due to cooling requirements for the heat generated by the electronic devices 220 in the racks) a fewer number of cooling units 216 within the particular layer, column, or cluster.

In some aspects, each particular layer, column, or cluster (or other sub-unit of the server rack frame assembly 210) may be reconfigured over an operating lifetime of the data center system 200. For example, reconfiguration may include moving particular server racks 214 (or 215 or 217) from particular bays 212 to other bays 212. In such reconfigurations, a number of cooling units 216 may not change, but such cooling units 212 may also be moved from particular bays 212 to other bays 212 (e.g., to account for movement of heat sources from one location to another location). Reconfigurations may also include replacing server racks 214 with higher power server racks 215 or 217 within particular bays 212. In such reconfigurations, a number of cooling units 216 may increase (e.g., to account for additional heat generated by the higher power racks 215 or 217) within a particular layer, column, or cluster. Reconfigurations may also include replacing server racks 217 with lower power server racks 215 or 214 within particular bays 212. In such reconfigurations, a number of cooling units 216 may decrease (e.g., to account for less heat generated by the lower power racks 215 or 214) within a particular layer, column, or cluster. Reconfigurations may also include removing server racks 214 (or 215 or 217) from particular bays 212. In such reconfigurations, a number of cooling units 216 may decrease (e.g., to account for less heat generated) within a particular layer, column, or cluster. In such reconfigurations, for example, when a particular bay 212 does not include any server rack 214 (or 215 or 217) or cooling unit 216, a blank-off panel (e.g., sheet metal or otherwise) may be installed across a width and height of the bay 212 to prevent airflow from being circulated through the empty bay 212.

While FIG. 1B shows the clusters 211a-211d within a single row 208 of the server rack frame assembly 210, each cluster 211 may represent a particular configuration at a particular operating time of the data center system 200 for illustrative purposes. For example, cluster 211a may represent a configuration at an initial operating time of the system 200, with only four server racks 214 and one cooling unit 216 within the nine total bays 212 of the cluster 211*a*. At the initial operating time, only a single cooling unit 216 may be needed to remove the heat generated by the four server racks 214. Empty bays 212 may include blank-off panels as previously described.

Cluster 211*b* may represent a configuration at a later operating time of the system 200, with eight server racks 214 and one cooling unit 216 within the nine total bays 212 of the cluster 211*b*. At the later operating time, still only a single cooling unit 216 may be needed to remove the heat generated by the eight server racks 214. In this configuration, no bays 212 are empty.

Cluster 211*c* may represent a configuration at another later operating time of the system 200, with seven server racks 215 and two cooling units 216 within the nine total bays 212 of the cluster 211*c*. At this later operating time, two single cooling units 216 may be needed to remove the heat generated by the seven server racks 215, which, as described, may have more computing power and thus generate more heat than the server racks 214, and thus require additional cooling power (through the additional cooling units 216) to remove the generated heat.

Cluster 211*d* may represent a configuration at still another later operating time of the system 200, with six server racks 217 and three cooling units 216 within the nine total bays 212 of the cluster 211*d*. At this later operating time, three single cooling units 216 may be needed to remove the heat generated by the six server racks 217, which, as described, may have more computing power and thus generate more heat than the server racks 214 and 217, and thus require additional cooling power (through the additional cooling units 216) to remove the generated heat.

With respect specifically to FIG. 2A, the cooling units 216 are positioned adjacent the server racks 214 (or 215 or 217) in the bays 212. In some aspects, each cooling unit 216 may comprise a form factor (e.g., dimensions such as width and height) that is similar to or the same as a form factor (e.g., dimensions such as width and height) of the server racks 214 (or 215 or 217). In some aspects, while a width and a height of the cooling units 216 are the same as or similar to the width and height, respectively, of the server racks 214 (or 215 or 217), a depth of the cooling unit (e.g., as shown in FIG. 2B), may be different (e.g., larger) than a depth of the server racks 214 (or 215 or 217). Thus, in some aspects, each cooling unit 216 may be positioned in any of the bays 212, and each server rack 214 (or 215 or 217) may be positioned in any of the bays 212, thereby making the cooling units 216 and server racks 214 (or 215 or 217) interchangeable within the server rack frame assembly 210.

In some aspects, the cooling units 216 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 216 may be stand-alone refrigerant-based (DX) cooling units fluidly coupled to one or more condensing units located external to the data center building 202 (e.g., conventionally known as "CRAC" units). For instance, as shown in FIG. 2B, a rack structure 250 (e.g., pipe rack or otherwise) may be positioned to support cooling fluid supply 252 and cooling fluid return 254 conduits that are fluidly coupled to the source of cooling liquid as well as cooling fluid junctions 256. The rack structure 250 may also support, in this example, power conductors 262 that provide electrical power from a source of electrical power to the racks in the server rack frame assemblies 210.

In this example, the cooling fluid junctions 256 may be mounted on or near the server rack frame assemblies 210 and fluidly connected to, e.g., cooling coils, that are part of the cooling units 216. In some aspects, a single cooling fluid junction 256 may be fluidly coupled to supply and return connections of cooling coils in several cooling units, e.g., all of the cooling units 216 in a particular layer, all of the cooling units 216 in a particular column, all of the cooling units 216 in a particular cluster, or otherwise.

As show in more detail in FIGS. 2B-2C, a warm air aisle 218 is defined between adjacent rows 208 of server rack frame assemblies 210, with open back sides 224 of the server rack frame assemblies 210 facing the warm air aisle 218. Although only two rows 208 and one warm air aisle are shown in FIGS. 2B and 2C, the data center building 202 may house multiple rows 208 with warm air aisles 218 defined between pairs of rows 208 of the server rack frame assemblies 210. In this example implementation, the open back sides 224 of the frame assemblies 210 allow for airflow with minimal or no pressure gradient between the backs of the server racks 214 (or 215 or 217) (which are also open) that face the warm air aisle 218 and the warm air aisle 218 itself. Similarly, the server rack frame assemblies 210 have, in this example, open front sides 222 that face the cool air aisles 220. The open front sides 222 of the frame assemblies 210 allow for airflow with minimal or no pressure gradient between the fronts of the server racks 214 (or 215 or 217) (which are also open) that face the cool air aisle 220 and the cool air aisle 220 itself. Thus, in some aspects, an air pressure at the fronts and backs of the server racks 214 (or 215 or 217), which are open to the aisles 220 and 218, respectively, are substantially equal or equal to an air pressure within the aisles 220 and 218, respectively.

In operation, the cooling units 216 circulate a cooling airflow 228 through the front sides 222 of the server racks 214 (or 215 or 217) (e.g., that are open to the human-occupiable workspace 204. The cooling airflow 228 receives heat from electronic devices 220 in the racks 214 (or 215 or 217) and warms the airflow 228 to a heated airflow 226 that enters the warm air aisle 218. The heated airflow 226 is drawn back into the cooling units 216 (e.g., by fans in the units 216) and cooled through the one or more cooling coils (e.g., by a flow of the chilled liquid, condenser water, refrigerant, or an electrically-powered cooler such as a Peltier cooler). The cooled airflow 228 is circulated (e.g., by the fans) back into the human-occupiable workspace 204 adjacent the front sides 222 of the server racks 214 (or 215 or 217) and server rack frame assemblies 210.

FIGS. 3A-3C are schematic illustrations of an isometric, front, and side view, respectively, of an example implementation of a cooling unit 300 that may be used in either of the data center systems 100 or 200 of FIGS. 1A-1C or FIGS. 2A-2C, respectively, as one or more of the cooling units 116 or cooling units 216.

Cooling unit 300 includes a base 308 onto which are mounted an intake plenum 302, a cooling coil 304, and a fan wall 307 that includes, in this example, multiple (e.g., four) fans 306. The base 308, as shown may be "palletized" in that it includes multiple slots 318 at a front side of the base 308 for forklift forks (or other mechanized lifting device) to move the cooling unit 300. Thus, the cooling unit 300 may be moved and lifted, e.g., into bays of a server rack frame assembly, as a single piece unit. In some aspects, a similar palletized base can be installed onto one or more server racks (e.g., racks 114, 214, 215, 217), such that a common equipment mover (e.g., fork lift or an automated mover) can move and transport both the server racks and cooling units in a data center.

The intake plenum 302, in this example implementation, includes a seal 310 that extends on lateral sides of the cooling unit 300 (and can also extend on top and bottom sides of the unit 300) to attach to, e.g., a server rack frame assembly when the cooling unit 300 is mounted in a bay. The seal 310 may also block airflow from circulating external to the cooling coil 304, such as around the sides of the coil 304. In some aspects, the intake plenum 302 may also include a filtration device (e.g., media, UV lighting, or otherwise) to clear an airflow that circulates through the cooling unit 300.

The cooling coil 304 includes an inlet 314 that is connected to a supply header 322 and an outlet 312 (that can also be connected to a return header, not shown). In this example, the cooling coil 304 is an air-to-liquid heat exchanger that can receive a cooling liquid (e.g., chilled water or glycol, condenser water, or other liquid which has a temperature less than a temperature of a heated airflow that enters the coil 304) and cool a heated airflow to produce a cooling airflow. A modulating control valve 316 is positioned in fluid communication with the inlet 314 in this example, but also may be positioned in fluid communication with the outlet 312, to control a flow rate of the cooling liquid circulated to the cooling coil 304.

In this example implementation, the fans 306 are positioned on the fan wall 307 to draw an airflow through the cooling coil 304 and expel the cooled airflow from the cooling unit 300. Motor controllers 320 are mounted to the fan wall 307 in this example implementation and electrically coupled to power and control the fans 306. The motor controllers 320 may be, for example, variable frequency drives, motor starters for on/off control of the fans 306, or other type of motor controller. Although there are two motor controllers 320 shown in this example, there may be a 1:1 ratio of controllers 320 to fans 306 or even, for this example, a 1:4 ratio of controllers 320 to fans 306 (or other ratio).

As shown in FIG. 3C, a controller 330 is communicably coupled to the motor controllers 320. The controller 330 may implement one or more control schemes or loops to control the fans 306, e.g., to meet a predetermined pressure differential between a warm air aisle and a cool air aisle. In some aspects, the controller 330 may also be communicably coupled to the control valve 316 to control (e.g., modulate to open or to close) a flow of the cooling liquid to the cooling coil 304, e.g., to meet a leaving airflow temperature setpoint or an approach temperature (e.g., leaving air temperature minus entering cooling liquid temperature) of the coil 304.

FIG. 4 illustrates an example control loop 400 for controlling a data center cooling apparatus 412. In some embodiments, the cooling apparatus 412 may be similar to, for example, the cooling unit 300 shown in FIGS. 3A-3C, or other cooling apparatus described in the present disclosure. In some embodiments, the control loop 400 may control the cooling apparatus 412 to maintain and/or adjust a flow of cooling fluid to the cooling apparatus 412 to meet an approach temperature set point of the cooling apparatus 412. The approach temperature set point, in some embodiments, may be a difference between a leaving air temperature from the cooling apparatus 412 and an entering cooling fluid temperature to the cooling apparatus 412. In some embodiments, the illustrated cooling apparatus 412 may represent multiple cooling units in the data center, such as, for example, a group of cooling units, several groups of cooling units, or all of the cooling units in the data center.

As illustrated, the control loop 400 includes an input value 402 and a feedback value 414 that are provided to a summing function 404. In some embodiments, the input value 402 may represent a desired valve position (e.g., percentage open value) of a particular valve (or group of valves) associated with a particular cooling apparatus 412 in the data center. For example, the desired valve position may be 100% open. In some embodiments, the desired valve position may be about 95% open, thereby providing for some headroom for control of the valve.

The feedback value 414, in the illustrated embodiment, may represent the valve position (i.e., percent open) of the particular valve associated with the cooling apparatus 412. For example, the particular valve may be "X" percentile valve as determined based on flow rate data in the data center. In some embodiments, the particular valve may be the $2^{nd}$ percentile control valve, meaning that about 98% of the valves associated with cooling apparatus in the data center are at, or are less than, the valve position (i.e., percent open) of the $2^{nd}$ percentile valve.

The summing function 404 compares the input value 402 and the feedback value 414 and provides an output value 406 to a controller 408. Of course, in some embodiments, the summing function 404 is implemented by the controller 408. In some embodiments, the controller 408 may be a main controller of the cooling system of the data center, which is communicably coupled to each control valve of the data center and/or the individual controllers associated with the control valves. For example, the main controller may be a master controller communicably coupled to slave controllers at the respective control valves. In some embodiments, the controller 408 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations.

The controller 408 receives and/or determines the output value 406 (e.g., a difference between the input value 402 and the feedback value 414). Based on the output value 406, the controller 408 may adjust an approach temperature set point 410 communicated to the cooling apparatus 412. For example, if the output value 406 defines a difference between the input value 402 and the feedback value 414 greater than a threshold value (e.g., more than 1° C.), the approach temperature set point 410 may be adjusted by the controller 408.

If the feedback value 414 is less than the input value 402 (i.e., the X percentile valve is less open than desired), then the controller 408 may adjust the approach temperature set point 410 downward (i.e., decreased), thereby causing the control valve or valves to open and circulate more cooling fluid to the cooling apparatus 412. Alternatively, if the feedback value 414 is more than the input value 402 (i.e., the X percentile valve is more open than desired), then the controller 408 may adjust the approach temperature set point 410 upward (i.e., increased), thereby causing the control valve or valves to close and circulate less cooling fluid to the cooling apparatus 412.

FIG. 5 is a schematic illustration of an example controller 500 (or control system) for a data center cooling system according to the present disclosure. For example, the controller 500 may be communicably coupled with, or as a part of, a data center control system that includes one or more cooling units, such as the cooling unit 300, to control one or more fans, one or more control valves, or both fan(s) and valve(s) of the module 300. In some aspects, the controller 500 may include the controller 330 shown in FIG. 3C.

The controller 500 is intended to include various forms of digital computers, such as printed circuit boards (PCB), processors, digital circuitry, or otherwise that is part of a vehicle. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 500 includes a processor 510, a memory 520, a storage device 530, and an input/output device 540. Each of the components 510, 520, 530, and 540 are interconnected using a system bus 550. The processor 510 is capable of processing instructions for execution within the controller 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the controller 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the controller 500. In one implementation, the storage device 530 is a computer-readable medium. In various different implementations, the storage device 530 may be a floppy disk device, a hard disk device, an optical disk device, or a tape device.

The input/output device 540 provides input/output operations for the controller 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A data center cooling system, comprising:
    a server rack frame assembly that comprises a plurality of bays defined along a lengthwise dimension of the frame assembly, each bay comprising a volume defined at least in part by a specified height that is orthogonal to the lengthwise dimension and a specified width that is parallel to the lengthwise dimension and sized to at least partially enclose at least one server rack configured to support a plurality of data center computing devices; and
    at least one cooling unit sized for a bay of the plurality of bays of the server rack frame assembly and configured to circulate a heated airflow from an open back side of the at least one server rack, cool the heated air, and circulate a cooling airflow through an open front side of the at least one server rack, wherein at least one perimeter dimension of the cooling unit is based on a form factor of the at least one server rack.

2. The data center cooling system of claim 1, wherein the specified width and the specified height of the bay are based on a form factor of the at least one server rack.

3. The data center cooling system of claim 1, wherein the at least one server rack comprises two server racks, each of the two server racks providing between 5 kW and 60 kW of computing power.

4. The data center cooling system of claim 1, wherein the at least one perimeter dimension comprises a cooling unit width and a cooling unit height.

5. The data center cooling system of claim 1, wherein the cooling unit comprises:
    a cooling module; and
    at least one fan positioned to circulate heated airflow through the cooling module.

6. The data center cooling system of claim 5, wherein the cooling module comprises an air-to-liquid heat exchanger, and the cooling unit further comprises a modulating valve fluidly coupled to at least one of a fluid inlet or a fluid outlet of the air-to-liquid heat exchanger.

7. The data center cooling system of claim 1, wherein the plurality of bays are arranged in a first row of bays and a second row of bays that is positioned vertically above the first row of bays.

8. The data center cooling system of claim 7, wherein the plurality of bays are further arranged in a third row of bays that is positioned vertically above the second row of bays.

9. The data center cooling system of claim 8, wherein the server rack frame assembly comprises:
    a first portion that defines the first row of bays;
    a second portion stacked on top of the first portion that defines the second row of bays; and
    a third portion stacked on top of the second portion that defines the third row of bays.

10. A method of cooling a data center comprising:
    circulating, with at least one cooling unit, a cooling airflow from a human-occupiable workspace of a data center through an open front side of at least one server rack configured to support a plurality of data center computing devices, the at least one server rack positioned in one of the bays of a plurality of bays of a server rack frame assembly that are defined along a lengthwise dimension of the frame assembly, each bay comprising a volume defined at least in part by a specified height that is orthogonal to the lengthwise dimension and a specified width that is parallel to the lengthwise dimension and sized to at least partially enclose the at least one server rack, the at least one cooling unit sized for one of the bays of the plurality of bays of the server rack frame assembly, wherein the specified width and the specified height of the bay are based on a form factor of the at least one server rack, and the at least one perimeter dimension of the cooling unit is based on the form factor of the at least one server rack;
    circulating, with the at least one cooling unit, a heated airflow that comprises heat from the plurality of data center computing devices through an open back side of the at least one server rack into a warm air aisle arranged adjacent the frame assembly;
    circulating, with the at least one cooling unit, the heated airflow from the warm air aisle and through the at least one cooling unit to cool the heated airflow; and
    circulating the cooling airflow from the at least one cooling unit into the human occupiable workspace.

11. The method of claim 10, further comprising:
    cooling the heated air with an air-to-liquid heat exchanger of the cooling unit; and
    controlling a flow of a cooling liquid to the air-to-liquid heat exchanger with a modulating valve that is fluidly coupled to at least one of a fluid inlet or a fluid outlet of the air-to-liquid heat exchanger.

12. The method of claim 10, wherein the plurality of bays are arranged in a first row of bays and a second row of bays that is positioned vertically above the first row of bays.

13. The method of claim 12, further comprising:
    circulating the heated airflow from the at least one server rack that is mounted in one of the bays in the first row of bays to the at least one cooling unit that is mounted in one of the bays in the second row of bays; and
    circulating the cooling airflow, with the at least one cooling unit that is mounted in the one of the bays in the second row of bays, from the human-occupiable workspace through the at least one server rack that is mounted in the one of the bays in the first row of bays.

14. The method of claim 13, further comprising:
    circulating the heated airflow from the at least one server rack that is mounted in one of the bays in the first row of bays to the at least one cooling unit that is mounted in one of the bays in the second row of bays that is positioned vertically above the one of the bays in the first row of bays; and
    circulating the cooling airflow, with the at least one cooling unit that is mounted in the one of the bays in the first row of bays, from the human-occupiable workspace through the at least one server rack that is mounted in the one of the bays in the first row of bays.

15. The method of claim 10, further comprising selecting the at least one cooling unit based at least in part on an expected heat output of the at least one server rack and a cooling capacity of the at least one cooling unit.

16. The method of claim 15, wherein the at least one server rack comprises a plurality of server racks, the method further comprising:
adjusting a power density of the plurality of server racks; and
based on the adjusted power density, adjusting a cooling capacity of the at least one cooling unit.

17. The method of claim 16, wherein adjusting a power density of the plurality of server racks comprises at least one of:
adding a specified number of server racks to the plurality of server racks;
removing a specified number of server racks from the plurality of server racks; or
replacing at least a portion of the plurality of server racks with another portion of server racks that comprise an increased or reduced power density of the replaced portion of the plurality of server racks.

18. The method of claim 16, wherein the at least one cooling unit comprises a plurality of cooling units, and adjusting the cooling capacity of the at least one cooling unit comprises at least one of:
adding a specified number of cooling units to the plurality of cooling units;
removing a specified number of cooling units from the plurality of cooling units; or
replacing at least a portion of the plurality of cooling units with another portion of cooling units that comprise an increased or reduced cooling capacity of the replaced portion of the plurality of cooling units.

19. A data center cooling system, comprising:
at least two rows of server racks positioned within a data center building, each row comprising:
a server rack frame assembly that comprises a plurality of bays defined along a lengthwise dimension of the frame assembly, each bay comprising a volume defined at least in part by two specified dimensions, where the plurality of bays comprise a first portion of bays within the frame assembly along the lengthwise dimension at a first level and a second portion of bays within the frame assembly along the lengthwise dimension at a second level above the first level;
a plurality of server racks configured to support a plurality of data center computing devices, at least one server rack positioned in a bay in the first portion of bays and at least another server rack positioned in a bay in the second portion of bays; and
a plurality of cooling units, each sized for a bay of the plurality of bays of the server rack frame assembly, at least one cooling unit positioned in a bay in the first portion of bays and at least another cooling unit positioned in a bay in the second portion of bays, wherein at least one perimeter dimension of the cooling unit is based on a form factor of a particular server rack of the plurality of server racks; and
a control system communicably coupled to the plurality of cooling units, the control system configured to control the plurality of cooling units to perform operations comprising:
circulating a heated airflow from open back sides of the plurality of server racks through the plurality of cooling units;
cooling, in the plurality of cooling units, the heated air; and
circulating a cooling airflow through open front sides of the at plurality of server racks.

20. The data center cooling system of claim 19, wherein the two specified dimensions comprise a specified height that is orthogonal to the lengthwise dimension and a specified width that is parallel to the lengthwise dimension.

21. The data center cooling system of claim 19, wherein the two specified dimensions are based on the form factor of the particular server rack of the plurality of server racks.

22. The data center cooling system of claim 19, wherein each cooling unit comprises at least one cooling coil fluidly coupled to a cooling liquid junction of a plurality of cooling liquid junctions, each cooling liquid junction fluidly coupled to a source of a cooling liquid and to two or more cooling coils.

23. The data center cooling system of claim 22, wherein each cooling unit further comprises a modulating valve fluidly coupled to at least one of a fluid inlet or a fluid outlet of the cooling coil.

24. The data center cooling system of claim 19, wherein the plurality of bays are further arranged in a third portion of bays that is positioned vertically above the second portion of bays.

25. The data center cooling system of claim 24, wherein the server rack frame assembly comprises:
a first frame sub-assembly that defines the first portion of bays;
a second frame sub-assembly stacked on top of the first portion that defines the second portion of bays; and
a third frame sub-assembly stacked on top of the second portion that defines the third portion of bays.

26. A method of cooling a data center comprising:
circulating, with at least one cooling unit, a cooling airflow from a human-occupiable workspace of a data center through an open front side of at least one server rack configured to support a plurality of data center computing devices, the at least one server rack positioned in one of the bays of a plurality of bays of a server rack frame assembly that are defined along a lengthwise dimension of the frame assembly, each bay comprising a volume defined at least in part by a specified height that is orthogonal to the lengthwise dimension and a specified width that is parallel to the lengthwise dimension and sized to at least partially enclose the at least one server rack, the at least one cooling unit sized for one of the bays of the plurality of bays of the server rack frame assembly, and the plurality of bays are arranged in a first row of bays and a second row of bays that is positioned vertically above the first row of bays;
circulating, with the at least one cooling unit, a heated airflow that comprises heat from the plurality of data center computing devices through an open back side of the at least one server rack into a warm air aisle arranged adjacent the frame assembly;
circulating the heated airflow from the at least one server rack that is mounted in one of the bays in the first row of bays to the at least one cooling unit that is mounted in one of the bays in the second row of bays;
circulating, with the at least one cooling unit, the heated airflow from the warm air aisle and through the at least one cooling unit to cool the heated airflow;

circulating the cooling airflow from the at least one cooling unit into the human occupiable workspace; and circulating the cooling airflow, with the at least one cooling unit that is mounted in the one of the bays in the second row of bays, from the human-occupiable workspace through the at least one server rack that is mounted in the one of the bays in the first row of bays.

27. The method of claim 26, wherein the specified width and the specified height of the bay are based on a form factor of the at least one server rack, and the at least one perimeter dimension of the cooling unit is based on the form factor of the at least one server rack.

28. The method of claim 26, further comprising:
cooling the heated air with an air-to-liquid heat exchanger of the cooling unit; and
controlling a flow of a cooling liquid to the air-to-liquid heat exchanger with a modulating valve that is fluidly coupled to at least one of a fluid inlet or a fluid outlet of the air-to-liquid heat exchanger.

29. The method of claim 26, further comprising:
circulating the heated airflow from the at least one server rack that is mounted in one of the bays in the first row of bays to the at least one cooling unit that is mounted in one of the bays in the second row of bays that is positioned vertically above the one of the bays in the first row of bays; and
circulating the cooling airflow, with the at least one cooling unit that is mounted in the one of the bays in the first row of bays, from the human-occupiable workspace through the at least one server rack that is mounted in the one of the bays in the first row of bays.

30. The method of claim 26, further comprising selecting the at least one cooling unit based at least in part on an expected heat output of the at least one server rack and a cooling capacity of the at least one cooling unit.

31. The method of claim 30, wherein the at least one server rack comprises a plurality of server racks, the method further comprising:
adjusting a power density of the plurality of server racks; and
based on the adjusted power density, adjusting a cooling capacity of the at least one cooling unit.

32. The method of claim 31, wherein adjusting a power density of the plurality of server racks comprises at least one of:
adding a specified number of server racks to the plurality of server racks;
removing a specified number of server racks from the plurality of server racks; or
replacing at least a portion of the plurality of server racks with another portion of server racks that comprise an increased or reduced power density of the replaced portion of the plurality of server racks.

33. The method of claim 31, wherein the at least one cooling unit comprises a plurality of cooling units, and adjusting the cooling capacity of the at least one cooling unit comprises at least one of:
adding a specified number of cooling units to the plurality of cooling units;
removing a specified number of cooling units from the plurality of cooling units; or
replacing at least a portion of the plurality of cooling units with another portion of cooling units that comprise an increased or reduced cooling capacity of the replaced portion of the plurality of cooling units.

34. A method of cooling a data center comprising:
circulating, with at least one cooling unit, a cooling airflow from a human-occupiable workspace of a data center through an open front side of a plurality of server racks configured to support a plurality of data center computing devices, at least one server rack of the plurality of server racks positioned in one of the bays of a plurality of bays of a server rack frame assembly that are defined along a lengthwise dimension of the frame assembly, each bay comprising a volume defined at least in part by a specified height that is orthogonal to the lengthwise dimension and a specified width that is parallel to the lengthwise dimension and sized to at least partially enclose the at least one server rack, the at least one cooling unit sized for one of the bays of the plurality of bays of the server rack frame assembly;
circulating, with the at least one cooling unit, a heated airflow that comprises heat from the plurality of data center computing devices through an open back side of the at least one server rack into a warm air aisle arranged adjacent the frame assembly;
circulating, with the at least one cooling unit, the heated airflow from the warm air aisle and through the at least one cooling unit to cool the heated airflow;
circulating the cooling airflow from the at least one cooling unit into the human occupiable workspace;
adjusting a power density of the plurality of server racks; and
based on the adjusted power density, adjusting a cooling capacity of the at least one cooling unit.

35. The method of claim 34, wherein the specified width and the specified height of the bay are based on a form factor of the at least one server rack, and the at least one perimeter dimension of the cooling unit is based on the form factor of the at least one server rack.

36. The method of claim 34, further comprising:
cooling the heated air with an air-to-liquid heat exchanger of the cooling unit; and
controlling a flow of a cooling liquid to the air-to-liquid heat exchanger with a modulating valve that is fluidly coupled to at least one of a fluid inlet or a fluid outlet of the air-to-liquid heat exchanger.

37. The method of claim 34, wherein the plurality of bays are arranged in a first row of bays and a second row of bays that is positioned vertically above the first row of bays.

38. The method of claim 37, further comprising:
circulating the heated airflow from the at least one server rack that is mounted in one of the bays in the first row of bays to the at least one cooling unit that is mounted in one of the bays in the second row of bays; and
circulating the cooling airflow, with the at least one cooling unit that is mounted in the one of the bays in the second row of bays, from the human-occupiable workspace through the at least one server rack that is mounted in the one of the bays in the first row of bays.

39. The method of claim 38, further comprising:
circulating the heated airflow from the at least one server rack that is mounted in one of the bays in the first row of bays to the at least one cooling unit that is mounted in one of the bays in the second row of bays that is positioned vertically above the one of the bays in the first row of bays; and
circulating the cooling airflow, with the at least one cooling unit that is mounted in the one of the bays in the first row of bays, from the human-occupiable workspace through the at least one server rack that is mounted in the one of the bays in the first row of bays.

40. The method of claim 34, further comprising selecting the at least one cooling unit based at least in part on an expected heat output of the at least one server rack and a cooling capacity of the at least one cooling unit.

41. The method of claim 40, wherein adjusting a power density of the plurality of server racks comprises at least one of:
- adding a specified number of server racks to the plurality of server racks;
- removing a specified number of server racks from the plurality of server racks; or
- replacing at least a portion of the plurality of server racks with another portion of server racks that comprise an increased or reduced power density of the replaced portion of the plurality of server racks.

42. The method of claim 40, wherein the at least one cooling unit comprises a plurality of cooling units, and adjusting the cooling capacity of the at least one cooling unit comprises at least one of:
- adding a specified number of cooling units to the plurality of cooling units;
- removing a specified number of cooling units from the plurality of cooling units; or
- replacing at least a portion of the plurality of cooling units with another portion of cooling units that comprise an increased or reduced cooling capacity of the replaced portion of the plurality of cooling units.

* * * * *